United States Patent [19]

Sichart et al.

[11] Patent Number: 4,852,097
[45] Date of Patent: Jul. 25, 1989

[54] METHOD FOR FORMING DATA BLOCK PROTECTION INFORMATION FOR SERIAL DATA BIT SEQUENCES BY MEANS OF CYCLICAL BINARY CODES

[75] Inventors: Frithjof V. Sichart, Muenchen; Christian Hollstein, Ostercoppaeln; Klaus Kirchberger, Muenchen, all of Fed. Rep. of Germany

[73] Assignee: Siemens Aktiengesellschaft, Berlin and Munich, Fed. Rep. of Germany

[21] Appl. No.: 76,002

[22] Filed: Jul. 21, 1987

[30] Foreign Application Priority Data

Jul. 21, 1986 [DE] Fed. Rep. of Germany ....... 3624599

[51] Int. Cl.$^4$ .......................................... G06F 11/10
[52] U.S. Cl. ........................................ 371/37; 371/38
[58] Field of Search ...................... 371/37, 38, 39, 40

[56] References Cited

U.S. PATENT DOCUMENTS

| | | | |
|---|---|---|---|
| 4,486,780 | 12/1984 | Ive | 371/37 |
| 4,593,393 | 6/1986 | Mead | 371/37 |
| 4,700,350 | 10/1987 | Douglas | 371/37 |
| 4,720,830 | 1/1988 | Joshi | 371/37 |

FOREIGN PATENT DOCUMENTS 0074627 8/1983 European Pat. Off.
2445508 4/1976 Fed. Rep. of Germany.

OTHER PUBLICATIONS

8049 IEE Proceedings Section A & I, vol. 130, No. 5, Aug. 1983, pp. 468-475.
Elektronik 1976, vol. 8, pp. 55-59.
IEEE Transactions on Information Theory, vol. 15, No. 1, Jan. 1969, pp. 109-111.
IBM Technical Disclosure Bulletin, vol. 8, No. 4 Sep. 1965, pp. 535-538.
Proc. IEE, vol. 117, No. 4, Apr. 1970, pp. 681-686.

Primary Examiner—Michael R. Fleming

[57] ABSTRACT

A data block protection information code word (BSI) is formed by division of a message polymonial representing a data bit sequence (D) by a generator polynomial representing a cyclical binary code. Registers are arranged in register chains in a coder unit provided for this purpose with a polynomial ordinal number being allocated to every register representing a member of the binary code. Given the presence of a term at the ordinal corresponding to the registers (R) of the respective register chains (RK) missing in the polynomial ordinal seris, a respective logic element (V) is inserted to which an operation information is supplied, said operation information being formed in a means for the formation of the operation information (EBV) by parallel processing of a plurality of data bits together with information at the outputs of the registers (R) corresponding to the highest polynomial ordinals. As a result thereof, the processing speed of a coder unit is reduced, and thus, making possible the use of programmable or computer-controlled coder units with high speed data transmission rates.

19 Claims, 1 Drawing Sheet

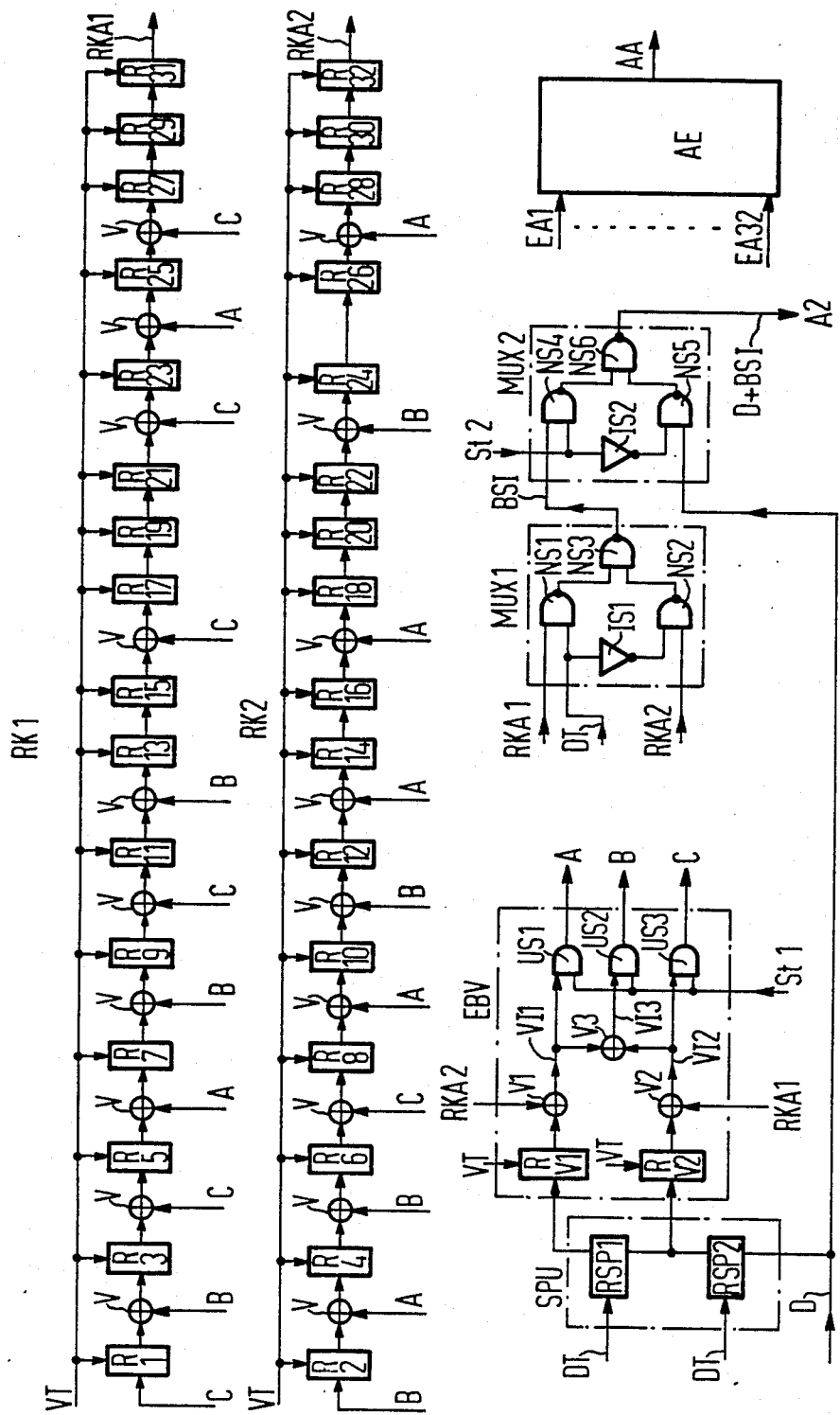

METHOD FOR FORMING DATA BLOCK PROTECTION INFORMATION FOR SERIAL DATA BIT SEQUENCES BY MEANS OF CYCLICAL BINARY CODES

BACKGROUND OF THE INVENTION

The invention is directed to a method for data protection in the transmission of serial data bit sequences, by use of data block protection information generated with the assistance of cyclical binary codes formed in a coder unit at the transmission and a corresponding coder unit at the reception side.

In information technology, the data protection of serial data bit sequences to be transmitted is predominantly carried out by block protection methods with cyclical binary codes. The employment of cyclical binary codes in block protection methods principally serves the purpose of an effective error detection in the transmission of serial data bit sequences via transmission links. The periodical "Elektronik", 1976, Pages 55-59, discloses such a data protection method with cyclical binary codes, as well as circuits for realizing the method. The data block protection information for a block, or for a defined plurality of data bits to be transmitted, is identified by the division of a message polynomial representing the data bit sequence by a generator polynomial representing the cyclical binary code. The division remainder is serially attached to the data bit sequence at the transmission side as a code word signifying data block protection information, and is transmitted with the data. At the receiving side, the block protection information code word is identified from the received data bit sequence, on the basis of the known data block protection method, and is compared to data block protection information generated at the transmission side and transmitted with the data. Given faultless transmission of the data bit sequence, the two data block protection information code words coincide; given faulty transmission, the presence of an error can be recognized on the basis of the result by a noncomparison, and conclusions can be drawn regarding the type of error such as, for example, a single error, a double error or an error burst. The data block protection information is generated in a coder unit composed of a plurality of registers connected in sequence following one another. Every register has a polynomial ordinal number corresponding to the binary code polynomial allocated to it, in ascending sequence, whereby every register represents one member of the binary code polynomial.

A binary division element, constructed by an exclusive-OR or a half-adder circuit, is inserted following those registers which represent a member of the binary code polynomial provided with terms. One input and the outputs of the logic elements are respectively connected to the preceding and the following registers. The output of the register provided with the highest polynomial ordinal number is connected to the input of a further division element. The data bit sequence to be protected is connected to the second input of this further division element. The output of the further division element is connected to all of the second inputs of the first series of division elements, as well as to the input of the register provided with the lowest polynomial ordinal number. The clocking of the registers is synchronized with the bit clock of the data bit sequence.

This method is preferably realized in coder units which are formed of a plurality of discrete circuits or which are implemented in a mask-programmable, integrated circuit, which can be referred to as a "customized" circuit. Computer-controlled coder units can also be utilized at lower transmission rates. The steadily increasing quantities of data to be transmitted in the shortest possible time in communications technology leads to a constant increase in the transmission rates, whereby a power-consumption-intensive, discrete circuit technology is required and implementation in a mask-programmable integrated circuit is now only possible with certain limitations, and the realization in a computer-controlled coder unit is no longer possible.

BRIEF DESCRIPTION OF THE INVENTION

The object of the invention is to specify a method for forming data block protection information code words for a coder unit with which the required dissipated power using discrete circuits is reduced and which enables the realization of a maskprogrammable, integrated circuit or a computer-controlled coder unit. This object is achieved by a coder unit in which respective registers representing the members of the binary code polynomial and binary logic elements are arranged such that the binary block protection information code word is identified by means of a binary arithmetic operation with a message polynomial defined by the bit sequence of a data block and with a binary code polynomial of a degree G representing the cyclical binary code and defined terms in the form of the remainder of the arithmetic operation thereby arising and said block protection information code word is serially attached to the end of the data block at the transmission side and, at the reception side, a locally generated code word is supplied in parallel with the received block protection information code word to a comparator utilized for error detection.

The advantage achieved by the invention is that the processing clock for forming block protection information code word is reduced by parallel processing of information of a plurality of data bits, and information is provided at the outputs of the registers with the highest ordinal numbers, these registers being arranged in a plurality of parallel register chains. The number of register chains, as well as the division performed in the individual register chains, and the allocation of the polynomial ordinal numbers to the individual registers, is based only on the reduction in processing clock to be achieved.

In an embodiment of the invention, the maximum processing clock reduction is achieved for a prescribed number of register chains when the number of registers connected following one another is selected the same for each register chain, with the number of register chains corresponding to a whole part of the degree G of the binary code polynomial, and the polynomial ordinal numbers being individually cyclically distributed onto the register chains. Given such a register chain arrangement, the number k of register chains corresponds to the number k of data bits to be serially read into the serial-to-parallel converter means. Moreover, the number k of register chains agrees with the number of register outputs having the highest ordinal numbers, whereby these register outputs are identical to the register chain outputs.

In a further aspect of the invention, a distribution of the registers onto the register chains which is no longer uniform is selected. in order, for example, to achieve a prescribed processing speed. However, instead of the information appearing at the register chain outputs, the information appears at the outputs of the registers representing the highest polynomial ordinal numbers.

In an embodiment of the invention; a multiplexer means is provided in the coder unit located at the transmission side, this multiplexer means cyclically sensing the outputs of the register chains in the data bit clock of the data bit sequence, whereby the data block protection information code word is read out bit-by-bit from the register chains, which bits are serially available at the output of the multiplexer means. In addition to the serial-to-parallel conversion of the data block protection information, this multiplexer means also undertakes the transformation of the various bit clock rates of the data block protection information.

The present invention provides methods for comparing the two data block protection information code words, the result of which generally differ in the quality of the comparison results. In one method, the comparison result contains detailed information about the type and number of errors of a data bit sequence transmission, requiring a considerable complexity in the circuit of the comparison means, due to the detailed investigation of the block protection information. In another method, an information signal can be formed which merely indicates the error free or nonerror-free transmission of a data bit sequence. Since the data bit sequence must usually be re-transmitted when a transmission error is recognized, detailed information about the type and frequency of occurrence of the transmission error can be omitted. This method is especially advantageous, since the system components that are used for forming the data block protection information code words are also utilized for the comparison of the data block protection information code words formed at the transmission side and at the reception side using an evaluation circuit that is easy to construct, whereby the comparison result is evaluated, and an information signal regarding the transmission quality is supplied.

BRIEF DESCRIPTION OF THE DRAWINGS

An exemplary embodiment of the invention shall be set forth in greater detail below with reference to the drawing, which illustrates a functional block diagram of apparatus embodying the invention. Connections between some of the component parts shown in the drawings are omitted for clarity, but are designated with corresponding legends.

DESCRIPTION OF THE PREFERRED EMBODIMENT

The exemplary embodiment is based on a binary code polynomial that is provided for the formation of a data block protection information code word for the bit sequence to be transmitted in a ring circuit access control for a local network, and which is defined in the following way in the ANSI/IEEE 802.5 Standard:

$$G(x) = x^{32} + x^{26} + x^{23} + x^{22} + x^{16} + x^{12} + x^{11} + x^{10} + x^8 + x^7 + x^5 + x^4 + x^3 + x + 1.$$

This binary code polynomial comprises 15 terms, whereby every term represents a polynomial member provided with the coefficient value 1. As in the known method, the number of required registers is dependent on the degree of the binary code polynomial, for which reason 32 registers are arranged in the exemplary embodiment. Further, a processing rate of the means for forming the data protection information code words, which approximately corresponds to half the bit clock rate of the data bit sequence, is assumed for the exemplary embodiment. To this end, a division of the registers into two register RK1 and RK2 chains respectively provided with the same number of registers is required.

The two register chains RK1 and RK2 are each composed of sixteen registers R connected following one another. Connected to these register chains are a serial-to-parallel converter SPU, a circuit for forming the operation information EBV, and two multiplexers MUX1 and MUX2, and an evaluation means AE for evaluating the data block protection information code word generated at the transmission side and at the reception side, is also shown in the drawing.

Every register R of the register chains RK1 and RK2 represent a member with defined ordering of the binary code polynomial, whereby the polynomial ordinal numbers per register chain RK1, RK2 are distributed according to the sequence n, n+k, n+2k, +..+, n+(G): k−1 (k), with k=2(two register chains) and n equal to the number of registers allocated to the respective register chain RK1 or Rk2. When the ordinal of a register R represents a term of the binary code polynomial, then a logic element V is inserted following this register R. An input of this logic element V is connected to the output of the preceding register R, and the output of the logic element V is connected to the input of the following register R. All registers R are clocked by the processing clock VT, which also clocks the means for forming the data protection information EBV. To this end, the clock inputs of all registers R are supplied with the processing clock VT. The processing clock VT can be derived from the data bit clock DT of the data bit sequence D, by means not shown here, or can be generated in a separate clock means which is likewise not shown.

The data bit sequence D to be protected is connected to the input of a register RSP2 and is read into this register RSP2 bit-by-bit in synchronism with the data bit clock DT of the data bit sequence D, and into a following register RSP1 where it is stored, the registers RSP2 and RSP1 forming a two stage shift register. The two registers RSP1 and RSP2 represent the serial-to-parallel converter means SPU. The outputs of the two registers RSP1 and RSP2 are each connected in parallel to the inputs of two further registers RV1, RV2. With these two registers RV1 and RV2, the data bit information stored in the serial-to-parallel converter means SPU are read out in synchronism with the processing bit clock VT and are forwarded to inputs of two logic elements V1 and V2. The second input of the first logic element V1 is connected to the output RKA2 of the register chain 2 and the second input of the second logic element V2 is connected to the output RKA1 of the register chain RK1. The first logic element V1 performs an exclusive-OR function with data bits of the data bit sequence D, and the information of the output RKA2 of the register chain RK2. A first operation information signal VI1 produced in this way, is supplied to those logic elements V of the register chains RK1, RK2 whose preceding register R represents a term of the binary code polynomial. The second logic element V2, likewise performs a binary exclusive-OR function, with the data bits read into the first register RSP2 and the information of the register chain end RKA1, the output of which is connected to the second input of the second logic element V2. The output of V2, viz., VI2, is forwarded to those second inputs of the logic elements V whose member of the binary code polynomial missing in the respective register chain RK1 and RK2 represents a term. The two operation information signals VI1, VI2 proceed to the two inputs of a third logic element V3, which performs an exclusive-OR function. A third operation information signal VI3 is formed, this being forwarded to those logic elements V of the register chains RK1, RK2 whose preceding register R as well as whose missing member of the respective register chain RK1, RK2 each represents a term of the binary code polynomial.

All three operation information signals VI1, VI2, VI3 are connected to inputs of three binary AND circuit elements US1, US2, US3. The respective second inputs of the AND circuit elements US1, US2, US3 are connected to a control input ST1. By appropriate application of binary information to the control input ST2, the forwarding of the three operation information signals VI1, VI2, VI3 to the outputs A, B and C of the AND circuit elements US1, US2 and US3 can be prevented. This is required, for example, during the read-out operation of the data block protection information BSI from the register chains RK1 and RK2. The output A of the means for forming the operation information EBV is connected to the respectively second inputs of the logic elements V of the two register chains RK1, RK2, which inputs are referenced A. Likewise, the outputs B and C of the means for forming the operation information EBV are connected to the respective second (referenced B and C, respectively) inputs of the logic elements V of the two register chains RK1, RK2.

Further, the two outputs RKA1 and RKA2 of the register chains RK1 and RK2 are connected to inputs of a first multiplexer means MUX1, viz., to respective inputs of two binary NAND circuit elements NS1 and NS2. The second inputs of these NAND circuit elements NS1 and NS2 are connected to receive the true and inverted data bit clock DT of the data bit sequence D. The two outputs of the NAND circuit elements NS1 and NS2 are connected to inputs of a third NAND circuit element NS3. These three NAND circuit elements NS1, NS2 and NS3, as well as the inverting circuit element IS1, form the first multiplexer means MUX1, with which the data block protection information BS1 is cyclically read out of the two register chains RK1 and RKS in synchronism with the data bit clock DT of the data bit sequence D. The output of MUX1 is connected to the input of a further multiplexer means MUX2. This second multiplexer means MUX2 likewise comprises three NAND circuit elements NS4, NS5 and NS6 and an inverting circuit element IS2, and is constructed like the multiplexer means MUX1 described above. The data bit sequence D is brought to the second input of this multiplexer means MUX2 via the gate NS3.

By applying appropriate control information to a control input ST2, connected to the inverting circuit element IS2, the data block protection information code word BS1 is supplied to the output A2 of this multiplexer means MUX2 after the data bit sequence D to be protected has passed through the second multiplexer means MUX2. Together, all system components described above, together with a controller (not shown), form a coder unit at the transmission side. The controller has the task of controlling the multiplexer means MUX1 and MUX2, as well as the means for forming the operation information EBV, such that the data block protection information code word BS1 is formed by the two register chains RK1 and RK2, and the means for forming the operation information EBV during the transmission of a data bit sequence D to be protected, and the data block protection information code word BS1 is attached at the appropriate time to the data bit sequence D or, respectively, transmitted in series at appropriate times by means of the multiplexer devices MUX1 and MUX2. Conventionally, the code word is transmitted following the data block.

In a coder unit at the reception side, the data block protection information BS1 is identified in the same way as in the coder unit at the transmission side, wherefore the system components such as the two register chains RK1 and RK2, as well as the means for forming the operation information EBV and the serial-to-parallel converter means SPU are required, arranged in the same way as shown. In addition, the coder unit at the reception side has the job of comparing the data block protection information code word BS1 formed at the reception side, and the data block protection information BS1 code word formed at the transmission side and transmitted with the data, and of forming an appropriate information signal given inequality of the two data block protection information code words BS1. To this end, the data block protection information BS1 formed in the coder unit at the reception side and stored in the two register chains RK1 and RK2 is binarily divided by the data block protection information BS1 formed at the transmission side, being binarily divided by means of the method of the invention. Given error-free transmission of the data bit sequence D, the division remainder of this binary division comprises the binary value 0 and an information or syndrome representing the binary value 0 lies at all outputs of all registers R of the two register chains RK1 and RK2 at the conclusion of the division.

The outputs of all registers R are connected to the inputs EA1 through EA32 of the evaluation means AE. In this evaluation means, a cascade circuit of a plurality of binary AND and NAND circuit elements identifies whether the information representing the binary 0 is present at all outputs of the registers R. When all inputs EV1 through EV32 of the evaluation means AE represent binary 0, then an information signal appears at the output AA of the evaluation means AE which identifies the error-free transmission of the most recently received data bit sequence D. When a division remainder unequal to binary 0 derives from the division of the two data block protection information signals BS1, then an information signal identifying the faulty transmission of the most recently received data bit sequence D proceeds to the output AA of the evaluation means AE. This method, which accomplishes the comparison of the two data block protection information code words BS1, can be realized with a minimum of additional circuit complexity since the comparison of the two data block protection information code words BS1 is carried out in the same way as the formation of the data block protection information and an evaluation of the remainder of the division of the two data block protection information code words BS1 is subsequently carried out by means of simple binary circuit elements. Since, given the occurrence of one or more errors during the transmission of a data bit sequence D, the transmission must usually be repeated, an investigation of the type and frequency of occurrence of the transmission errors can be omitted. Of course, this comparison can instead be carried out in a comparator means which is not shown, but which would be constructed in a significantly more complex fashion.

In order to bring all registers R into a defined operating condition, such as binary 1 status at all outputs of the registers R, before every formation of a data block protection information code word BS1 for an arbitrary data bit sequence D, a binary NAND circuit element (not shown) is inserted preceding each register R. One input of this NAND circuit element is connected to the output of the preceding register R or to the output of the preceding logic element V, when such is present. The output of the NAND circuit element is connected to the input of the corresponding register R. All second inputs of the NAND circuit elements are connected in common to the control means. By time-suited application of a signal which corresponds to the binary 1, the outputs of the NAND circuit elements and the outputs of the registers R are switched into a defined initial status before the formation of a further data block protection information code word BS1. All registers R are realized by flip-flop circuit elements.

All system components set forth above can be realized both with discrete circuit technology as well as in a maskprogrammable, integrated circuit or as an instruction sequence in a program-controlled computer system.

It will be apparent that various modifications and/or additions may be made in the apparatus of the invention without departing from the essential features of novelty involved, which are intended to be defined and secured by the appended claims.

I claim:

1. A method for data protection in the transmission of data blocks having serial data bit sequences, comprising the steps of:
   forming data block protection information code words by use of cyclical binary codes in a coder unit at the transmission side,
   forming corresponding code words with a coder unit at the reception side,
   providing each of said coders with registers representing the members of a binary code polynomial, and with binary logic elements arranged in relation to said registers so that a binary block protection information code word is produced by means of a binary arithmetic operation,
   employing the binary code polynomial defined by the data bit sequence of a data block as an operand in said arithmetic operation, and said binary block protection information code word defined as a result of said arithmetic operation,
   serially attaching said code word to the data block at the transmission side,
   comparing the transmitted code word with a code word generated at the receiving side, to derive an error detection signal,
   said registers (R) in said register chains (RK) being allocated, cyclically, from lowest to highest order in ascending sequence of the polynomial ordinal numbers of said binary code polynomial,
   said registers (R) being arranged following one another in a plurality of K register chains with K corresponding to the ration of the bit clock repetition rate (DT) of the data bit sequence (D) to the reduced processing clock repetition rate (VT) of the coder unit, with each such chain having a highest order register,
   converting the serial data bit sequence (D) to parallel form by parallel converter means receiving said bit sequence at the data clock rate (DT) and providing parallel bit sequences at said reduced clock rate (VT),
   forming a plurality of operation information signals in response to said converter means and the outputs of said highest order registers in said chains, and
   supplying said operation information signals to said logic elements which follow registers representing specific terms in the binary code polynomial, whereby the block protection information code word is formed by binary arithmetic operations in response to said data list and the outputs of said highest order registers at the rate of the processing clock (VT), and dependent on the connections of said operation information signals to said registers.

2. The method according to claim 1, including the steps of providing a plurality of registers (R) in each of said register chains (RK1 and RK2), the number K of register chain corresponding to a sub multiple of the degree of the binary code polynomial, with the ordinals of the polynomial being individually cyclically allocated to individual registers in each of said chains.

3. The method according to claims 1 or 2, including the step of allocating the polynomial ordinal numbers to the individual registers of each chin in the sequence N, $N+K, N+2K \ldots +N+(G/K-1)K$, in which N is an integer from 1 to K corresponding to an individual register chain.

4. The method according to claims 3, including the step that, in the case of the 2 through K missing binary code polynomial members between two registers (R) of a register chain, at the locations defined by the plurality mth of the first and of the missing members between the preceding register (R) of the register chain and the appearance of the term, dividing the mth bit of the 1 through K possible data bits by the output information of the mth bit of the register chains, and using the outputs produced thereby for forming operation information signals representing the position of terms of said polynomial and in the case of more than two terms at and between the first and second 2 through K missing binary code polynomial members, the operation information signals are binarily divided in accordance with the sequence of their presence, and dividing the result by a further correspondingly formed operation information, in the case of the presence of further terms in succession in accordance with the sequence of their presence, and operating the respective logic elements with corresponding outputs of said means for forming the operation information signals (EBV).

5. The method according to any of claims 4, including the steps of reading out the division remainder from the register chains (RK1 and RK2), in the coder unit at the transmission side, multiplexing the register chains (RK1 and RK2) in synchronism with the data bit clock (DT) of the data bit sequence (D), and attaching the serial block protection information code word (BSI) to the end of the data block information by multiplexing (MUX2).

6. The method according to any of claims 5, including the steps of comparing the data block protection information code word formed at the transmitter side with the data block protection information code word formed at the receiver side to produce a signal corresponding to the quality of said transmission indicating an error-free data bit sequence transmission or a data bit sequence transmission having a single error, or a data bit sequence transmission having a multiple error.

7. The method of any of claims 6, including the steps of binarily dividing the data block protection information code word (BSI) formed at the reception side and stored in the register chains (RK1 and RK2) by the data block protection information code word formed at the transmission side of the transmission, and inspecting the division remainder present at the register outputs, whereby when all of said outputs represent the binary "0", a signal indicating error-free data bit sequence transmission is generated, and, in the case of the different binary information at the register outputs, a signal indicating a faulty data bit sequence transmission is formed.

8. The method according to any of claims 7, including the step of employing exclusive-Or gates for said binary division elements.

9. Apparatus for generation of a code word for data protection in the transmission of serial data bit sequences, transmitted in synchronism with a bit clock (BT), comprising;
plural chains of registers corresponding to a binary code polynomial, said chains being connected as plural shift registers operating in synchronism with a sub multiple of said bit clock, and a plurality of logic units. interconnected between the outputs of some of said registers and the inputs of following registers, whereby each of said register chains executes a binary arithmetic operation using a lower clock repetition rate than said bit clock.

10. Apparatus according to claim 9, wherein said registers of said chains are each allocated to different orders of said binary code polynomial, in ascending sequence, and including means for connecting said logic elements with registers having orders corresponding to elements of said polynomial.

11. The method according to claim 9, including the steps of transmitting said bit sequence in series with said code word, forming a separate block protection code word at the receiving side of said transmission from said bit sequence, and comparing the code words formed at the transmitting and receiving sides for detection of a transmission error in said transmitted bit sequence.

12. The method according to claim 11, including the step of dividing the block protection information code word formed at the receiving side by the transmitted data block protection information code word, whereby a zero result manifests an error-free transmission.

13. Apparatus for transmitting serial data bit sequences in synchronism with a bit clock (BT) comprising, in combination;
a plurality of register chains connected as shift registers, said register chains each having a plurality of registers of different order, said registers being serially connected so that said registers are connected with sucessively higher orders of said registers connected in series, with a plurality of logic units interposed between a plurality of adjacent pairs of said registers,
means for clocking said register chains at a clock rate (VT), which is a sub multiple of said bit clock (BT),
a series-to-parallel converter for converting a data block made up of said data bit sequence into a plurality of multi-bit words, and for manifesting said words in parallel, in synchronism with said clock (VT),
an operational signal generator connected to said series-to-parallel converter for receiving said words and connected to the highest order registers of said register chains for developing control signals,
means for connecting said control signals to said logic units, whereby said register chains develop a data block protection information code word corresponding to said data bit sequence,
means for transmitting said code word with said data block, and
means for developing a code word at the receiving side of said transmission for comparison with said transmitted code word to detect transmission errors.

14. Apparatus according to claim 13, including multiplex means connected to the highest order registers of said register chains for developing a serial code word for transmission with said data block.

15. Apparatus according to claim 14, including a second multiplexer for forming a serial output comprising said data block and said code word.

16. Apparatus according to claim 13, wherein each of said register chains has the same number of registers, corresponding to a sub multiple of the degree of said polynomial.

17. Apparatus according to claim 16, wherein sequential registers in each of said chains are allocated to ordinal numbers of said polynomial in the sequence n, n+K, n+2K, wherein K is the number of chains and n is an integral number from 1 to K.

18. Apparatus according to claim 13, wherein said operational signal generator comprises logic means for generating a plurality of different control signals, in accordance with the bits of said data block and the outputs of said highest order registers of said chains, and means for distributing said different control signals to said logic units in accordance with the order of the polynomial represented by a register adjacent each of said logic units.

19. Apparatus according to claim 13, wherein said logic units comprise binary exclusive-OR units.

* * * * *